United States Patent [19]

Ijichi

[11] Patent Number: 4,590,61?

[45] Date of Patent: May 20, 198(

[54] ELECTRONIC TUNER HAVING SELECTABLE BAND SECTIONS APPROPRIATELY BIASED TO MIXER/AMPLIFIER

[75] Inventor: Sadayoshi Ijichi, Soma, Japan

[73] Assignee: Alps Electric Co., Ltd., Japan

[21] Appl. No.: 488,098

[22] Filed: Apr. 25, 1983

[30] Foreign Application Priority Data

Apr. 28, 1982 [JP] Japan .................. 57-62798[U]

[51] Int. Cl.⁴ ............................................ H03J 5/24
[52] U.S. Cl. ..................................... 455/190; 333/1
[58] Field of Search .................. 334/1, 15, 14, 16, 47, 334/55, 56; 455/189, 190, 191, 180, 314, 313

[56] References Cited

U.S. PATENT DOCUMENTS

| 4,009,441 | 2/1977 | Kumagai et al. | 455/190 ) |
| 4,189,678 | 2/1980 | Sakamoto et al. | 455/191 ) |
| 4,214,212 | 7/1980 | Dipietromaria | 455/19( |
| 4,271,529 | 6/1981 | Strammello, Jr. | 455/191 ) |
| 4,326,295 | 4/1982 | Matsumoto et al. | 455/190 ) |
| 4,438,529 | 3/1984 | Sato | 455/19( |

Primary Examiner—Eugene R. LaRoche
Assistant Examiner—Benny T. Lee
Attorney, Agent, or Firm—Guy W. Shoup

[57] ABSTRACT

An electronic tuner which includes an SHF band section in addition to ordinary UHF and VHF band sections for use in CATV, for example, has a diode and a resistor both connected between the VHF band section and a VHF band mixer stage. A transistor contained in the mixer stage is always appropriately biased by the diode and resistor, whether the mixer stage functions as a mixer or an amplifier.

1 Claim, 2 Drawing Figures

ELECTRONIC TUNER HAVING SELECTABLE BAND SECTIONS APPROPRIATELY BIASED TO MIXER/AMPLIFIER

FIELD OF THE INVENTION

The present invention relates to an electronic tuner and, more particularly, to such a tuner which includes a super high frequency band section, known as super band, performing amplification, tuning, mixing and other functions on only super band signals, in addition to ordinary UHF and VHF band sections. This kind of tuner is used in CATV application; for example.

BACKGROUND OF THE INVENTION

Referring to FIG. 1, there is shown an electronic tuner for CATV, as an example, which consists of a VHF band section 1 for receiving and amplifying a VHF band signal, a super band section 2 for receiving a super band signal to convert it into an intermediate frequency signal and to feed the resultant signal to the succeeding stage, a UHF band section 3 for receiving a UHF band signal to convert it into an intermediate frequency signal and to supply the converted signal to the succeeding stage, a VHF band local oscillator 4, a VHF band mixer stage 5, etc.

The VHF band section 1 acts to selectively amplify high or low channels of VHF, and it performs a tuning operation by altering the voltage applied to a tuning voltage terminal 11 and altering the capacitance of a variable capacitance diode in the section. Thus, if a voltage is applied to a VHF high band terminal 12, it will be possible to receive a VHF high band signal, and if a voltage is applied to a VHF low band terminal 13, a VHF low band can be received. In any case, when a voltage is applied to either the high band terminal 12 or low band terminal 13, the section 1 operates, and a signal selected and amplified thereby is fed to the VHF band mixer stage through a coupling capacitor 14. At this time, the local oscillator 4 operates and injects a local oscillation signal into the mixer stage 5 through an injection capacitor 41. Consequently, the mixer stage 5 acts as a mixer to produce an intermediate frequency signal at its output terminal 53.

Meanwhile, if a voltage is applied to a super band terminal 21, the super band section 2 operates. Thus, a voltage is applied to a switching diode 22 and a current flows through a resistor 23 and so the diode 22 is triggered into conduction. As a result, an intermediate frequency signal, which is produced as the section 2 receives the super band signal, is sent to the mixer stage 5 through the diode 22 and a coupling capacitor 24. At this time, the local oscillator 4 does not operate and so the mixer stage 5 functions as an amplifier with the result that an IF signal derived from the super band section 2 is amplified and appears at the output terminal 53.

Finally, if a voltage is applied to a UHF band terminal 31, the UHF band section 3 operates, and an IF signal, which is produced when a UHF band signal is received by this section, is fed to the mixer stage 5 through a switching diode 32 and a coupling capacitor 34 in the same manner as in the aforementioned super band section 2. At this time, the local oscillator 4 does not operate and so the mixer stage 5 functions as an amplifier. In this manner, an IF signal produced from the section 3 appears at its output terminal 53 after subjected to an amplification operation.

It is to be noted that in each of the above-mentioned operations, a constant voltage is applied to a transistor 54 in the mixer stage 5 by a bias circuit made up from resistors 16 and 51, as a matter of course.

In the circuit of FIG. 1 described so far, it is necessary to alter the values of the coupling capacitors 14, 24 and 34 in order to control the gain of the mixer stage 5. If the bias voltage most suitable to the case where the stage 5 is used as a mixer as encountered in receiving a VHF band signal is applied unchanged to the transistor 54, then a deterioration in the distortion characteristic of the mixer stage will result when the stage 5 is operated as an amplifier as in a case where the super band section 2 or UHF band section 3 is operated. Conversely, if the bias voltage optimal for the case where the stage 5 is operated as an amplifier is applied to the transistor without varying its magnitude when the stage acts as a mixer, then the gain will decrease extremely. Consequently, a trade-off between the mixer operation and the amplifier operation has been imposed on the design of this circuit. Also undesirably, this kind of circuit has unwanted couplings between the sections 1 and 2 and between the sections 1 and 3.

SUMMARY OF THE INVENTION

Accordingly, it is an object of the present invention to provide an electronic tuner which is capable of applying the best bias voltage to the transistor of a VHF band mixer stage, whether the mixer stage functions as a mixer or an amplifier, for removing the aforementioned difficulties and which minimizes the coupling between any two sections.

This object is accomplished, in accordance with the present invention, by providing an electronic tuner of the type comprising a VHF band section receiving a VHF band signal, a super band section receiving a super band signal, a UHF band section receiving a UHF band signal, and a VHF band mixer stage. Each output circuit of the super band and UHF band sections has a diode connected thereto, with a diode and a resistor both connected between the VHF band section and the VHF band mixer stage.

DETAILED DESCRIPTION OF THE INVENTION

Figure 1:
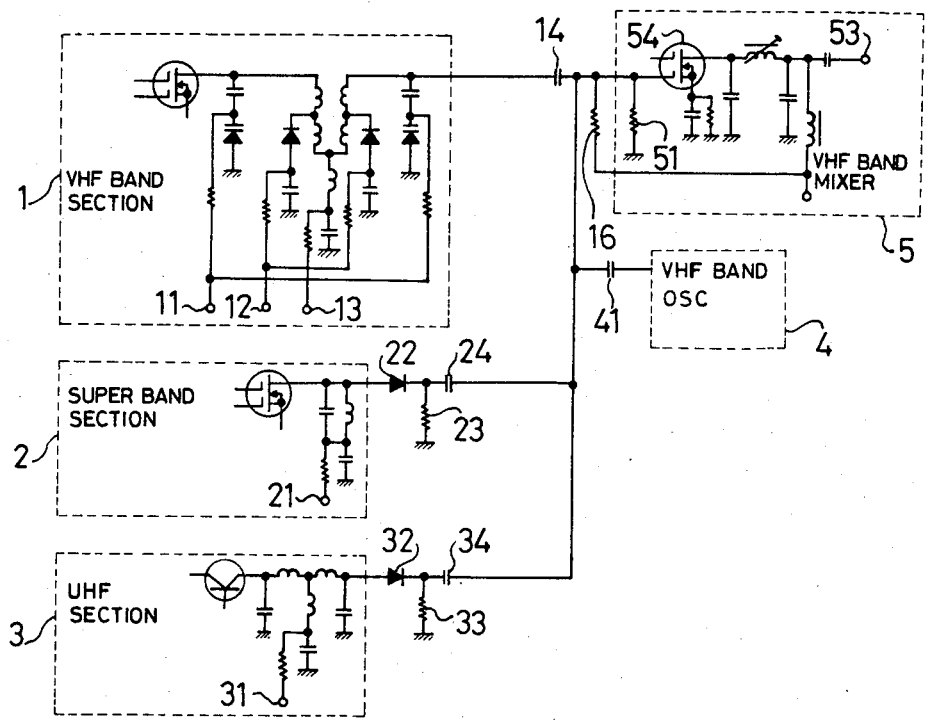
FIG. 1 is a circuit diagram of a conventional, electronic tuner.
Figure 2:
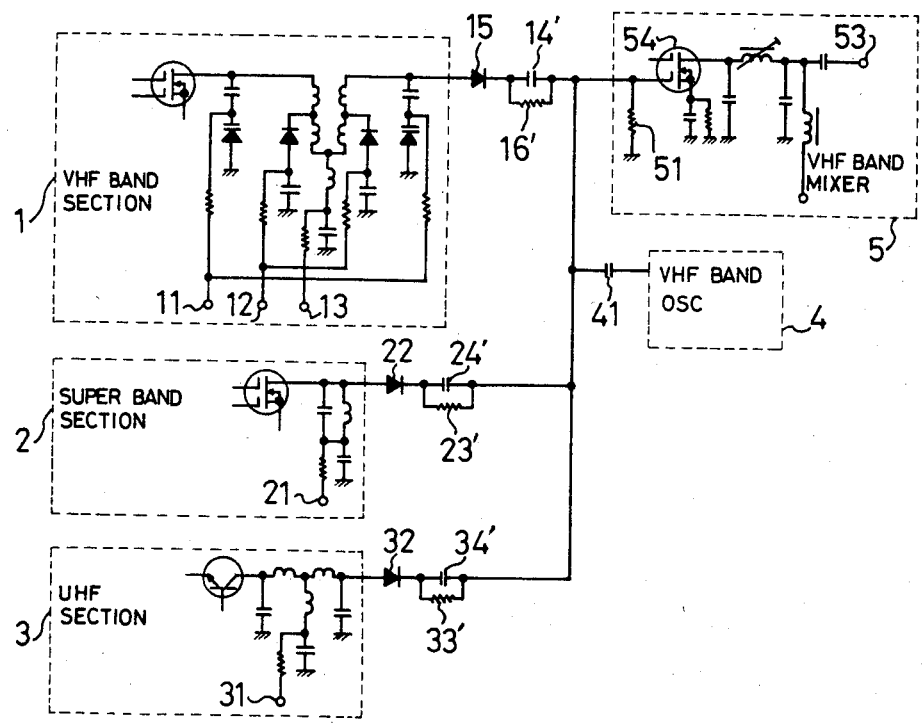
FIG. 2 is a circuit diagram of one embodiment of electronic tuner embodying the concept of the present invention.

Referring now to FIG. 2, there is shown one example of the present invention, in which parts similar to those in FIG. 1 are denoted by like reference numerals as in FIG. 1. The novel configuration further includes coupling capacitors 14', 24' and 34', a switching diode 15 and resistors 16', 23' and 33'.

VHF band section 1 alters the voltage applied to tuning voltage terminal 11 for tuning purposes in the same way as in FIG. 1. When a voltage is imposed on VHF band terminal 12, VHF high band can be received, whereas when a voltage is applied to VHF low band terminal 13, VHF low band can be received. In either case, a current flows through switching diode 15, resistor 16' and resistor 51 and so the diode 15 is triggered into conduction, whereby a radio frequency signal from the VHF band section 1 is transmitted to VHF mixer stage 5 via the diode 15 and the coupling capacitor 14'. At the same time, the oscillation output produced from VHF band local oscillator 4 is also injected into the mixer stage via injection capacitor 41. This causes the mixer stage 5 to operate as a mixer with the result that an IF signal appears at output terminal 53. At this time, it is possible to place such a bias voltage on transistor 54 as to operate the mixer best by appropriately setting the value of the resistor 16'. Simultaneously, a voltage set up by a current flowing through resistor 51 applies a reverse bias voltage to switching diodes 22 and 32, thus biasing these diodes off.

When a voltage is applied to the super band terminal 21, super band section 2 functions and a voltage is applied to the diode 22. Hence a current flows through the resistors 23' and 51, resulting in the diode 22 to be biased into conduction. As a result, an IF signal, which is derived from the section 2 by converting the super band signal into an intermediate frequency, is fed to the mixer stage 5 through the diode 22 and the capacitor 24'. At this time, the stage 5 operates as an amplifier rather than as a mixer and so an IF signal can be obtained from the output terminal 53. Again, it is possible to place such a bias voltage on the transistor 54 as to operate the amplifier best by appropriately selecting the value of the resistor 23'. Concurrently, a current flows through the resistor 51 producing a voltage, which applies a reverse bias voltage to the diodes 15 and 32 to bias these diodes off.

Finally, when a voltage is applied to UHF band terminal 31, UHF band section 3 functions, thus causing a current to flow through the diode 32, which acts in the same manner as in the case where a voltage is applied to the aforementioned SHF band terminal 21. Similarly to the previous cases, the best bias voltage can be supplied to the transistor 54 by appropriately selecting the value of the resistor 33'. Likewise again, a reverse bias voltage is applied to the diodes 15 and 22.

The novel configuration as described so far surpasses the conventional construction in the number of components by only one, that is the diode 15, but it yields various advantages as described below.

First, as the diodes coupling the sections are biased in the forward or reverse direction, unwanted couplings between the sections are reduced. Further, the bias voltage applied to the transistor of the mixer stage which operates as either a mixer or an amplifier is not fixed, but rather it can be set according to the operation of each section, thereby offering a greater degree of freedom in designing. When the stage 5 acts as a mixer, a current from 3 to 4 mA develops the best bias voltage for the transistor, for example. On the other hand, when the stage 5 acts as an amplifier, the gain of the transistor assumes a maximum value if a current from 7 to 10 mA, for instance, is applied to it. Therefore, if a super band or UHF band signal is to be received and if a higher gain is desired for the section used, then the value of the associated resistor should be set such that a current having the aforesaid magnitude flows. In a situation where the same gain is preferable for every section, the values of the coupling capacitors should be reduced. In this case, the transistor 54 handles a larger current, and therefore its distortion characteristic is improved.

Although the foregoing example uses an FET for the transistor 54, it is obvious that a bipolar transistor can be used instead. Also, the described VHF band section consists of a two-band configuration, but the section may be made up of a three-band structure.

What is claimed is:

1. In an electronic tuner having means including a VHF band section for processing signals in the VHF band to produce an output signal, means including a UHF band section for processing signals in the UHF band to produce an output signal, means including a super band section for processing signals in the super band to produce an output signal, and common means including a transistor circuit for mixing said output signal from said VHF band section with a local oscillation signal to produce an intermediate frequency signal during operation for VHF signals and amplifying either said output signal from said UHF band section or said output signal from said super band section during operation for UHF signals or super band signals, the improvement including bias means for applying a bias voltage of one level to said transistor circuit when mixing output signals from said VHF band section and a bias voltage of another level to said transistor circuit when amplifying said output signals of said UHF band section or said output signals from said super band section, said bias means including a respective diode and resistor pair connected in series between said common means and each of, said VHF band section, said UHF band section, and said super band section, and further including respective coupling capacitors, each coupled in parallel with a respective resistor for coupling the output of each said section to said common means.

* * * * *